(12) United States Patent
Tao et al.

(10) Patent No.: US 10,971,615 B2
(45) Date of Patent: Apr. 6, 2021

(54) HIGH POWER PERFORMANCE GALLIUM NITRIDE HIGH ELECTRON MOBILITY TRANSISTOR WITH LEDGES AND FIELD PLATES

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 136 days.

(21) Appl. No.: 16/058,388

(22) Filed: Aug. 8, 2018

(65) Prior Publication Data

US 2020/0052103 A1 Feb. 13, 2020

(51) Int. Cl.
*H01L 29/15* (2006.01)
*H01L 29/778* (2006.01)
*H01L 29/06* (2006.01)
*H01L 29/66* (2006.01)

(52) U.S. Cl.
CPC ...... *H01L 29/7787* (2013.01); *H01L 29/0615* (2013.01); *H01L 29/0638* (2013.01); *H01L 29/66462* (2013.01)

(58) Field of Classification Search
None
See application file for complete search history.

(56) References Cited

U.S. PATENT DOCUMENTS

| 8,890,168 | B2 | 11/2014 | Lidow et al. | |
| 9,941,399 | B2 | 4/2018 | Mishra et al. | |
| 10,002,956 | B1* | 6/2018 | Lin | H01L 29/7786 |
| 2007/0164315 | A1* | 7/2007 | Smith | H01L 29/7787 257/194 |
| 2015/0263104 | A1* | 9/2015 | Saito | H01L 29/7786 257/76 |
| 2018/0138306 | A1 | 5/2018 | Jeon et al. | |

FOREIGN PATENT DOCUMENTS

| CN | 101312207 B | 1/2011 |
| CN | 105097911 B | 11/2017 |

OTHER PUBLICATIONS

International Search Report and Written Opinion—PCT/US2019/036310—ISA/EPO—dated Sep. 26, 2019.

(Continued)

*Primary Examiner* — Hung K Vu
(74) *Attorney, Agent, or Firm* — Qualcomm Incorporated (57) ABSTRACT

Certain aspects of the present disclosure provide a high electron mobility transistor (HEMT). The HEMT generally includes a gallium nitride (GaN) layer and an aluminum gallium nitride (AlGaN) layer disposed above the GaN layer. The HEMT also includes a source electrode, a gate electrode, and a drain electrode disposed above the AlGaN layer. The HEMT further includes n-doped protuberance(s) disposed above the AlGaN layer and disposed between at least one of: the gate electrode and the drain electrode; or the source electrode and the gate electrode. Each of the n-doped protuberances is separated from the gate electrode, the drain electrode, and the source electrode.

10 Claims, 6 Drawing Sheets

(56) References Cited

OTHER PUBLICATIONS

Palankovski V., et al., "Field-Plate Optimization of AlGaN/GaN HEMTs," IEEE Compound Semiconductor Integrated Circuit Symposium, 2006, pp. 107-110.
Raj G., et al., "Polarization and Breakdown Analysis of AlGaN Channel HEMTs with AlN Buffer," World Journal of Condensed Matter Physics, Aug. 2015, vol. 05, No. 03, Article ID: 58950, 11 Pages, 10.4236/wjcmp.2015.53024.
Tirado J.M., et al., "2D Simulation of Static Surface States in AlGaN/GaN HEMT and GaN MESFET devices," Semiconductor Science and Technolog, 20, 2005, pp. 864-869.
Wurfl J., et al., "Techniques towards GaN Power Transistors with Improved High Voltage Dynamic Switching Properties," IEEE International Electron Devices Meeting, 2013, pp. IEDM13-144-IEDM13-147.

* cited by examiner

HIGH POWER PERFORMANCE GALLIUM NITRIDE HIGH ELECTRON MOBILITY TRANSISTOR WITH LEDGES AND FIELD PLATES

TECHNICAL FIELD

Certain aspects of the present disclosure generally relate to electronic circuits and, more particularly, to a gallium nitride (GaN) high electron mobility transistor (HEMT) with ledge(s) between gate and source/drain, e.g., for high performance power electronic chips, radio frequency (RF) components, etc.

BACKGROUND

High electron mobility transistors (HEMTs) are important components of devices used for high power, high data rate, and other similar applications. For example, HEMTs can be found in many high performance radio frequency front-end (RFFE) devices, power electronic chips, millimeter wave (mmW) circuits, etc. HEMTs are generally field-effect transistors (FETs) that use a junction between two materials with different bandgaps as the channel instead of a doped region (e.g., as is typically the case with a metal-oxide-semiconductor FET (MOSFET)).

Today, HEMTs are generally built with gallium nitride (GaN)-based materials, e.g., to support high power and high data rate applications. Compared to silicon (Si) and other group III-V materials, GaN typically has a higher bandgap, higher electron peak velocity, higher breakdown electric field, etc., making GaN suitable for such high power and high data rate applications.

SUMMARY

Certain aspects of the present disclosure provide a high electron mobility transistor (HEMT). The HEMT generally includes a gallium nitride (GaN) layer; an aluminum gallium nitride (AlGaN) layer disposed above the GaN layer; and a source electrode, a gate electrode, and a drain electrode disposed above the AlGaN layer. The HEMT also includes one or more n-doped protuberances disposed above the AlGaN layer and disposed between at least one of: the gate electrode and the drain electrode; or the source electrode and the gate electrode. Each of the one or more n-doped protuberances is separated from the gate electrode, the drain electrode, and the source electrode.

Certain aspects of the present disclosure provide a method for fabricating a high electron mobility transistor (HEMT). The method generally includes forming a gallium nitride (GaN) layer; forming an aluminum gallium nitride (AlGaN) layer above the GaN layer; and forming a source electrode, a gate electrode, and a drain electrode above the AlGaN layer. The method also includes forming one or more n-doped protuberances above the AlGaN layer and between at least one of: the gate electrode and the drain electrode; or the source electrode and the gate electrode. Each of the one or more n-doped protuberances is separated from the gate electrode, the drain electrode, and the source electrode.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide gallium nitride (GaN)-based high electron mobility transistors (HEMTs) suitable for high performance power electronic chips, radio frequency (RF) components, etc. More specifically, aspects presented herein may provide reduced surface states and/or increased breakdown voltage in GaN-based HEMTs for increased power switching efficiency and RF performance, for example. In some aspects, the GaN-based HEMT described herein may include n-doped ledge(s) disposed above an aluminum gallium nitride (AlGaN) layer (or region) to reduce the surface states, which may in turn increase the channel electron density in the channel at the heterojunction of the HEMT and reduce the on-resistance ($R_{on}$) of the HEMT.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected there between).

Figure 1:
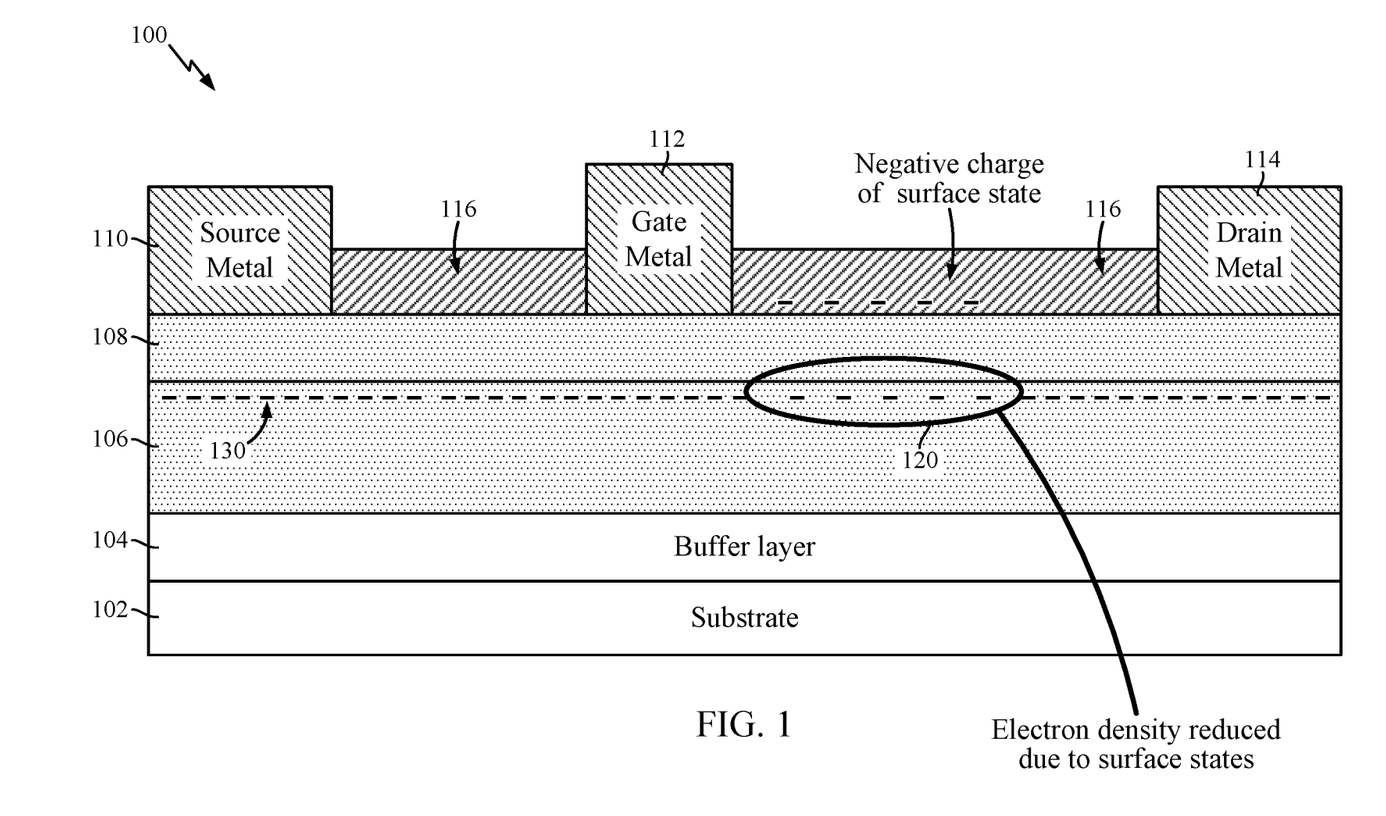
FIG. 1 illustrates a cross-sectional view of an example high electron mobility transistor (HEMT).

FIG. 1 illustrates a cross-sectional view of an example HEMT 100. The HEMT 100 includes a substrate 102, a buffer layer 104 disposed above the substrate 102, a semiconductor region 106 disposed above the buffer layer 104, and a semiconductor region 108 disposed above the semiconductor region 106. The HEMT further includes a source (metal) electrode 110, a gate (metal) electrode 112, and a drain (metal) electrode 114 disposed above the semiconductor region 108.

In HEMT 100, the semiconductor region 106 and the semiconductor region 108 may be different bandgap semiconductor regions, forming a region (or channel) 130 of dense electrons at the interface (e.g., heterojunction) between semiconductor region 106 and semiconductor region 108. For example, the semiconductor region 106 may include GaN, and the semiconductor region 108 may include AlGaN. Certain implementations of a HEMT 100 may use a dielectric layer and/or a passivation layer that is disposed above the semiconductor region 108. In this example, HEMT 100 includes a passivation layer 116 that is disposed between the source electrode 110 and the gate electrode 112, and/or disposed between the gate electrode 112 and the drain electrode 114. The passivation layer 116 may include any of various suitable passivation materials, such as silicon nitride ($Si_3N_4$), for example.

In HEMTs with a semiconductor region 108 having a first bandgap (e.g., with AlGaN) disposed above a semiconductor region 106 having a second, different bandgap (e.g., with GaN), the surface (e.g., at semiconductor region 108) may be negatively charged. Such a negatively charged surface state may reduce the electron density in the region (or channel) 130 between the semiconductor region 106 and the semiconductor region 108. FIG. 1 shows one reference example in which the electron density at a portion 120 of the region 130 is reduced due to the negatively charged surface state of the semiconductor region 108. This reduction in the electron density may make the HEMT 100 unsuitable, or at least non-ideal, for power devices that rely on high breakdown voltage, high switching efficiency, and high frequency transistors. Accordingly, to provide significantly higher performance of the HEMT for power electronics or RFFE devices in use today, it may be desirable for the electron density (e.g., in region 130) to be as high as possible for lower on-resistance ($R_{on}$) and increased efficiency of the HEMT. Additionally, it may also be desirable to allow for a smaller gate charge ($Q_g$) in order to operate the HEMT with faster switching speeds.

Certain aspects of the present disclosure provide a GaN-based HEMT with reduced surface states and/or increased breakdown voltage for increased power switching efficiency and RF performance, for example. In particular, as described in more detail below, the GaN-based HEMT may include one or more n-doped protuberances (e.g., ledge(s)) between the gate electrode and source/drain electrodes. The n-doped protuberance(s) may reduce the surface states, which may in turn increase the channel electron density and reduce $R_{on}$. The GaN-based HEMTs (e.g., with protuberance(s) and/or field plate(s)) described herein may provide significantly higher performance (relative to GaN-based HEMTs without protuberance(s) and/or field plate(s)) for RFFE, power electronic chips, mmW circuits, etc.

Figure 2:
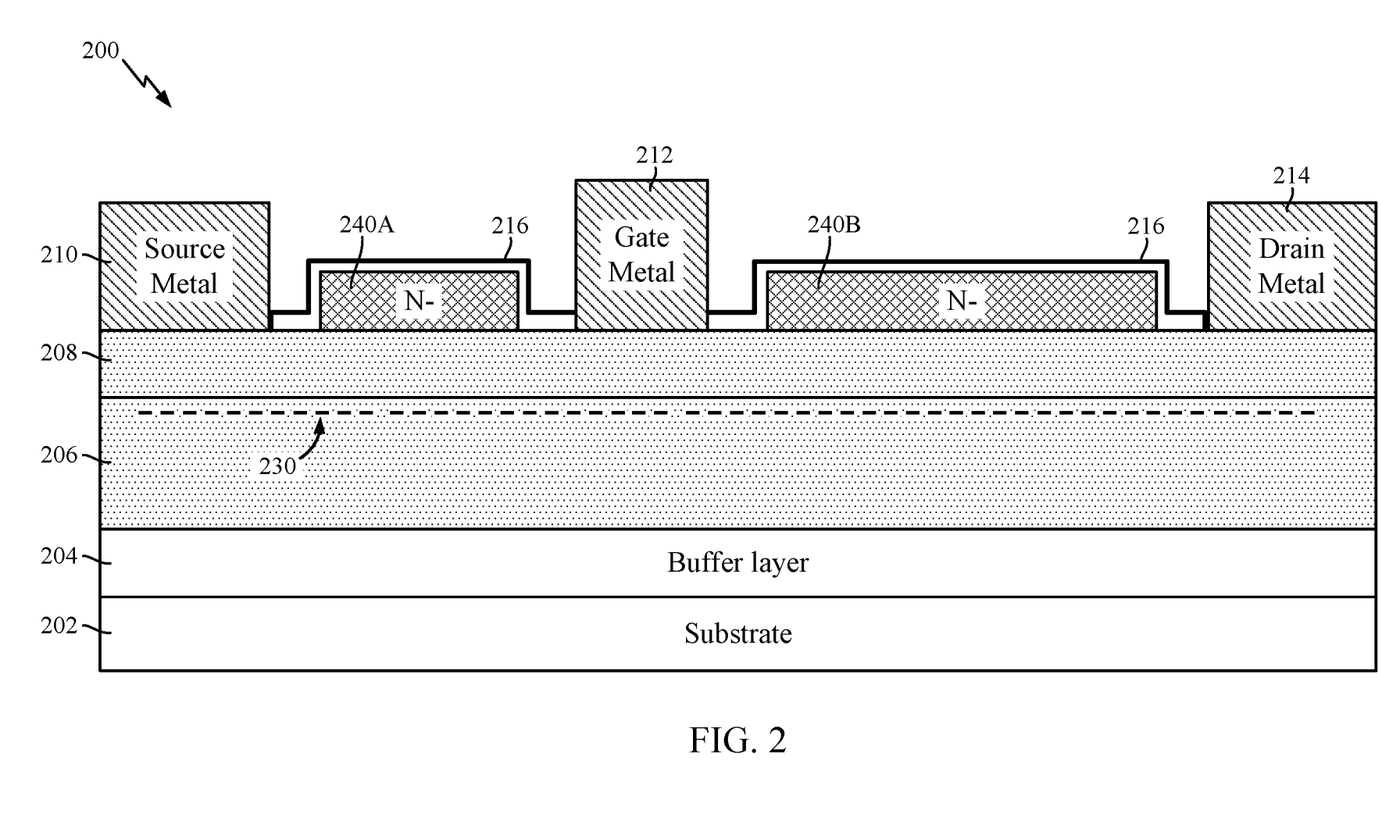
FIG. 2 illustrates a cross-sectional view of an example structure of a gallium nitride (GaN)-based HEMT with ledges, in accordance with certain aspects of the present disclosure.

FIG. 2 illustrates a cross-sectional view of an example GaN-based HEMT 200 with n-doped ledge(s) 240A and 240B, in accordance with certain aspects of the present disclosure. The ledge(s) 240A and 240B (as well as other ledges described throughout the present disclosure) represent a specific shape for the n-doped protuberance(s). However, the reader is to understand that any of various other suitable shapes may also be used for the protuberance(s), for any of the ledges described herein. The HEMT 200 includes a substrate 202, a buffer layer 204 disposed above the substrate 202, a semiconductor region 206 (e.g., with GaN) disposed above the buffer layer 204, and a semiconductor region 208 (e.g., with AlGaN) disposed above the semiconductor region 206. A region (or channel) 230 with dense electrons (e.g., high electron density) may be formed at the interface between the semiconductor region 206 and the semiconductor region 208, e.g., due to different bandgap semiconductor regions. The HEMT 200 also includes a source (metal) electrode 210, a gate (metal) electrode 212, and a drain (metal) electrode 214 disposed on (or otherwise above) the semiconductor region 208. The buffer layer 204 may include GaN, for example. The substrate 202 may include any of various suitable materials for growing (or otherwise forming) GaN, such as silicon (Si), silicon carbide (SiC), aluminum oxide ($Al_2O_3$), etc.

As shown, compared to HEMT 100, HEMT 200 includes one or more n-doped ledges 240A and/or 240B disposed on (or otherwise above) semiconductor region 208. In this particular example, n-doped ledge 240A is disposed between the source electrode 210 and the gate electrode 212, and n-doped ledge 240B is disposed between the gate electrode 212 and the drain electrode 214. Although only one n-doped ledge 240A is shown disposed between the source electrode 210 and the gate electrode 212 in the illustrated example, the reader is to understand that more than one n-doped ledge (or other protuberance) may be disposed between the source electrode 210 and gate electrode 212 for other aspects. Similarly, although only one n-doped ledge 240B is shown disposed between the gate electrode 212 and the drain electrode 214, the reader is to understand that more than one n-doped ledge (or other protuberance) may be disposed between the gate electrode 212 and drain electrode 214. Furthermore, these multiple protuberances may have the same or different shapes. A passivation layer 216 may be disposed on (or otherwise above) the n-doped ledge(s) 240A and/or 240B. The passivation layer 216 may include any of various suitable passivation materials, such as silicon nitride ($Si_3N_4$), for example. In some aspects, the HEMT 200 may include a dielectric layer (not shown) disposed above the n-doped ledge(s) 240A and/or 240B.

As also shown, each of the n-doped ledges 240A and 240B is separated from (e.g., not directly coupled to) the source electrode 210, gate electrode 212, and drain electrode 214. This separation between the n-doped ledges and the ohmic and gate contacts may reduce the amount of leakage and/or coupling between the n-doped ledges and the ohmic and gate contacts that may otherwise be present if the n-doped ledges were directly coupled to the ohmic and gate contacts.

The n-doped ledges 240A and 240B may include at least one of GaN, indium gallium nitride (InGaN), AlGaN, or aluminum nitride (AlN). The n-doped ledges 240A and 240B may reduce the (negative) charged surface states (of the semiconductor region 208), which may in turn increase the channel electron density in region 230 and thus reduce $R_{on}$. In some aspects, the amount of doping within each of the n-doped ledges 240A and 240B may be uniform. In some aspects, one or more dimensions, such as height, width, etc., of each n-doped ledge 240A and 240B may be based in part on the amount of doping within the respective n-doped ledge. For example, thinner n-doped ledges may be used for higher doping levels, and thicker n-doped ledges may be used for smaller doping levels.

Figure 3:
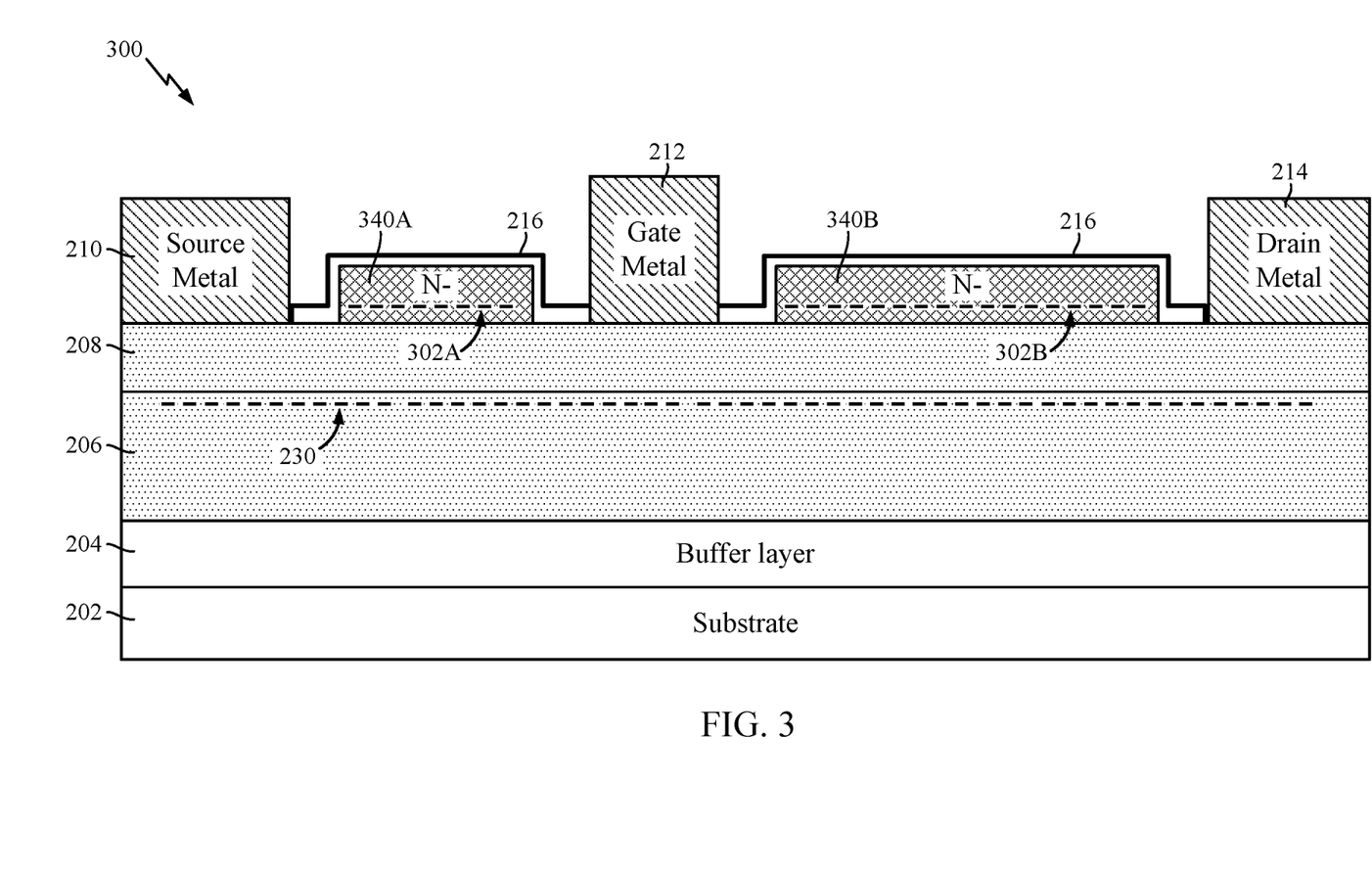
FIG. 3 illustrates a cross-sectional view of an example structure of another GaN-based HEMT with ledges, in accordance with certain aspects of the present disclosure.

FIG. 3 illustrates a cross-sectional view of another example GaN-based HEMT 300 with n-doped ledge(s) 340A and 340B, in accordance with certain aspects of the present disclosure. Compared to the HEMT 200 of FIG. 2, the HEMT 300 includes n-doped ledges 340A and 340B, in which the amount of doping within each of the n-doped ledges 340A and 340B is non-uniform. In some aspects, the amount of doping within each of the n-doped ledges 340A and 340B is vertically non-uniform (e.g., a planar doping, delta doping, etc.). As shown, for example, n-doped ledge 340A may include an n-doped delta region 302A, and n-doped ledge 340B may include an n-doped delta region 302B. The n-doped delta regions 302A and 302B represent areas of the n-doped ledges 340A and 340B, respectively, that have high doping concentrations relative to other areas of the respective n-doped ledges 340A and 340B. In some aspects, the n-doped delta regions 302A and 302B may be planar areas of the n-doped ledges 340A and 340B, respectively. Ledges that have a concentrated amount of doping (e.g., as in HEMT 300) may allow for further reduction of the surface states and may further prevent decreases in the breakdown voltage ($V_{db}$), compared to ledges with uniform doping levels (e.g., as in HEMT 200).

Figure 4:
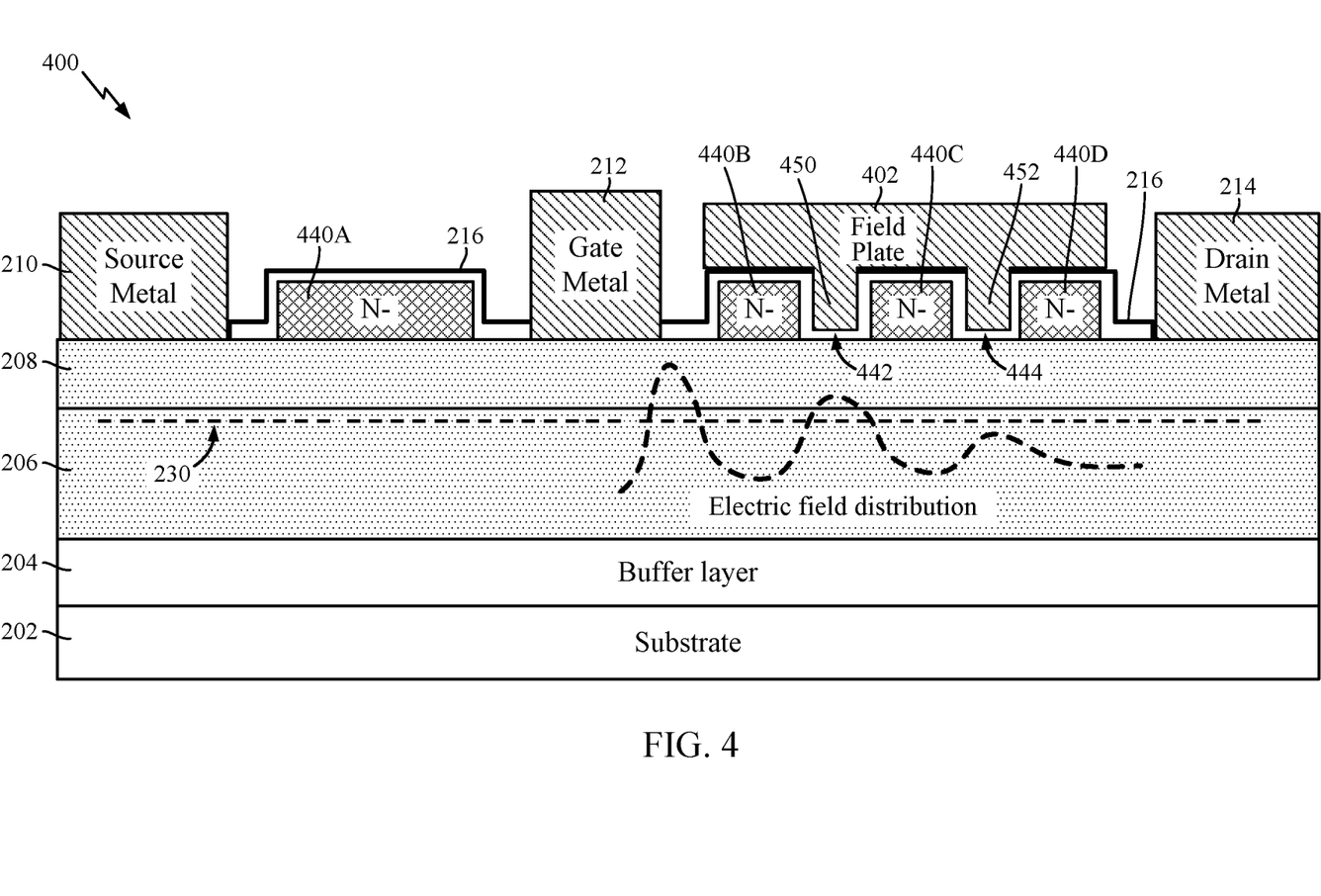
FIG. 4 illustrates a cross-sectional view of an example structure of a GaN-based HEMT with ledges and a field plate, in accordance with certain aspects of the present disclosure.

In some aspects, the GaN-based HEMTs described herein may also include field plates (in addition to n-doped ledge(s)) to improve the performance of the HEMTs for power electronics, for example. A field plate is generally a conductive (e.g., metallic) plate that is electrically coupled to the gate electrode or the source electrode. In some cases, a field plate may be an independent electrode having an external bias, or may be a floating electrode. FIG. 4 illustrates a cross-sectional view of an example GaN-based HEMT 400 with n-doped ledge(s) 440A, 440B, 440C, and 440D and a field plate 402, in accordance with certain aspects of the present disclosure. Compared to the HEMTs 200 and 300, the HEMT 400 includes a first n-doped ledge 440A disposed between the source electrode 210 and gate electrode 212, and multiple n-doped ledges 440B, 440C, and 440D disposed between the gate electrode 212 and the drain electrode 214. Although three n-doped ledges 440B, 440C, and 440D are shown in this particular example, the reader is to understand that one, two, or more than three n-doped protuberances (having the same or different shapes) may be disposed between the gate electrode 212 and the drain electrode. Similarly, although only one n-doped ledge 440A is illustrated in this example implementation, the reader is to understand that more than one n-doped protuberance (having the same or different shapes) may be disposed between the source electrode 210 and the gate electrode 212. In some aspects, the amount of doping within each of n-doped ledges 440A, 440B, 440C, and 440D may be uniform (e.g., similar to n-doped ledges 240A and 240B of HEMT 200) or non-uniform (e.g., similar to n-doped ledges 340A and 340B of HEMT 300). In some aspects, HEMT 400 may include n-doped ledge(s) with uniform doping levels and n-doped ledge(s) with non-uniform doping levels.

A field (metal) plate 402 is disposed above n-doped ledges 440B, 440C, and 440D. The field plate 402 may be electrically coupled (not shown) to the source electrode 210 or the gate electrode 212, and may be used to reduce the peak electric field (e.g., within the region 230), and in turn, increase the breakdown voltage ($V_{db}$). The passivation layer 216 may be disposed above the n-doped ledges 440A, 440B, 440C, and 440D, and further disposed between the field plate 402 and n-doped ledges 440B, 440C, and 440D.

In some aspects, the field plate 402 may extend into trenches formed between at least two n-doped ledges. As shown, for example, a trench 442 may be formed between n-doped ledge 440B and 440C, and a trench 444 may be formed between n-doped ledge 440C and 440D. In this aspect, the field plate 402 may include one or more protrusions 450 and 452 that extend into trenches 442 and 444, respectively. Dividing different regions of the ledges 440A, 440B, and 440C with the field plate 402 in this manner may further increase the uniformity of the electric field distribution (e.g., within region 230).

Figure 5:
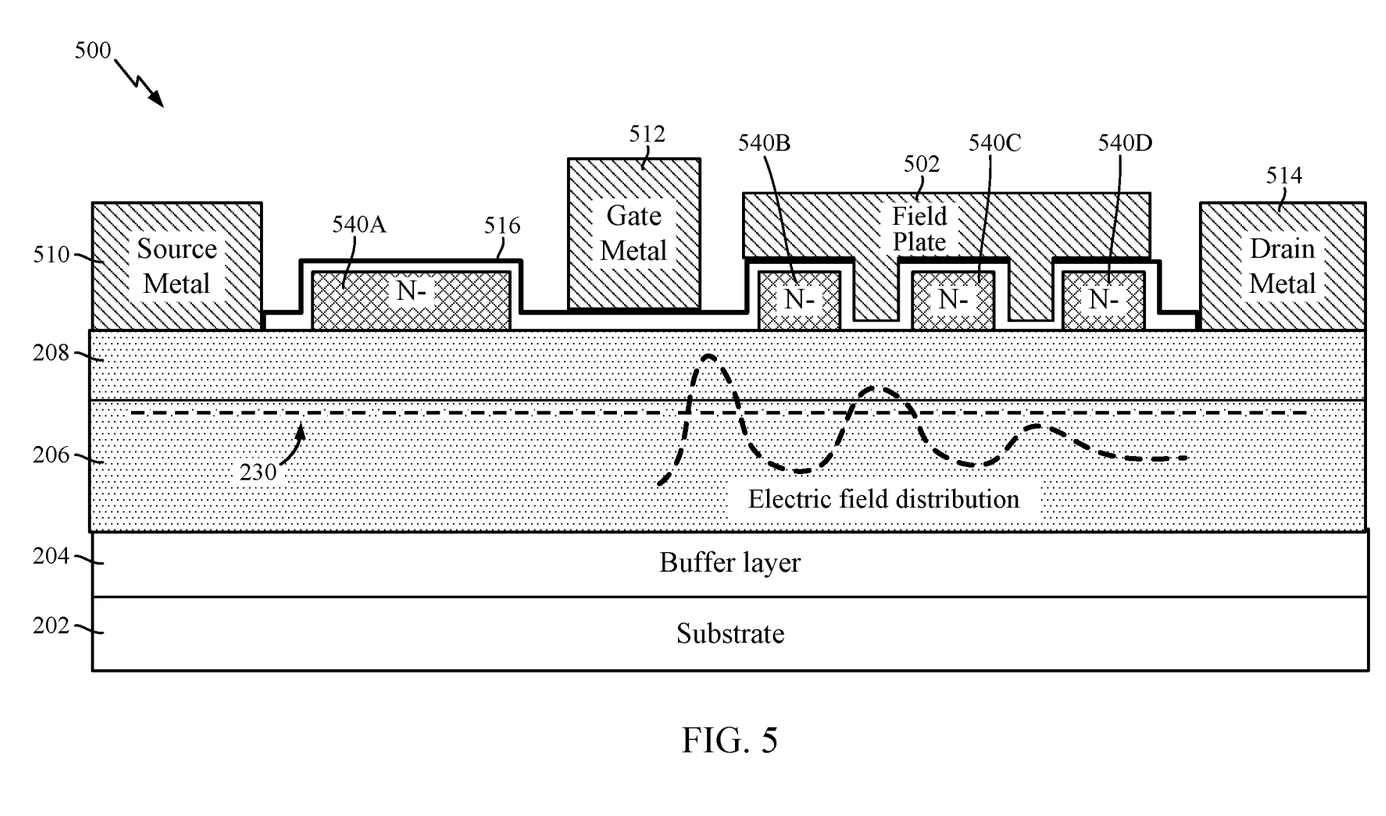
FIG. 5 illustrates a cross-sectional view of an example structure of a GaN-based metal-oxide-semiconductor (MOS) HEMT with ledges and a field plate, in accordance with certain aspects of the present disclosure.

FIG. 5 illustrates a cross-sectional view of an example of a metal-oxide-semiconductor (MOS) GaN-based HEMT 500 with n-doped ledge(s) 540A, 540B, 540C, and 540D, and a field plate 502, in accordance with certain aspects of the present disclosure. Similar to HEMT 400, the MOS HEMT 500 includes a source (metal) electrode 510, a gate (metal) electrode 512, and a drain (metal) electrode 514 disposed above a semiconductor region 208. However, compared to the gate electrode 212 of HEMT 400, the gate electrode 512 of MOS HEMT 500 is disposed above a layer 516, which is disposed between the gate electrode 512 and the semiconductor region 208. In some aspects, the layer 516 may include a passivation layer (e.g., with SiN). In some aspects, the layer 516 may include a dielectric layer. Note, the n-doped ledges 540A, 540B, 540C, and 540D may be similar to the n-doped ledges 240A and 240B of HEMT 200, the n-doped ledges 340A and 340B of HEMT 300, or the n-doped ledges 440A, 440B, 440C, and 440D of HEMT 400. Similarly, the field plate 502 may be similar to the field plate 402 of HEMT 400.

Figure 6:
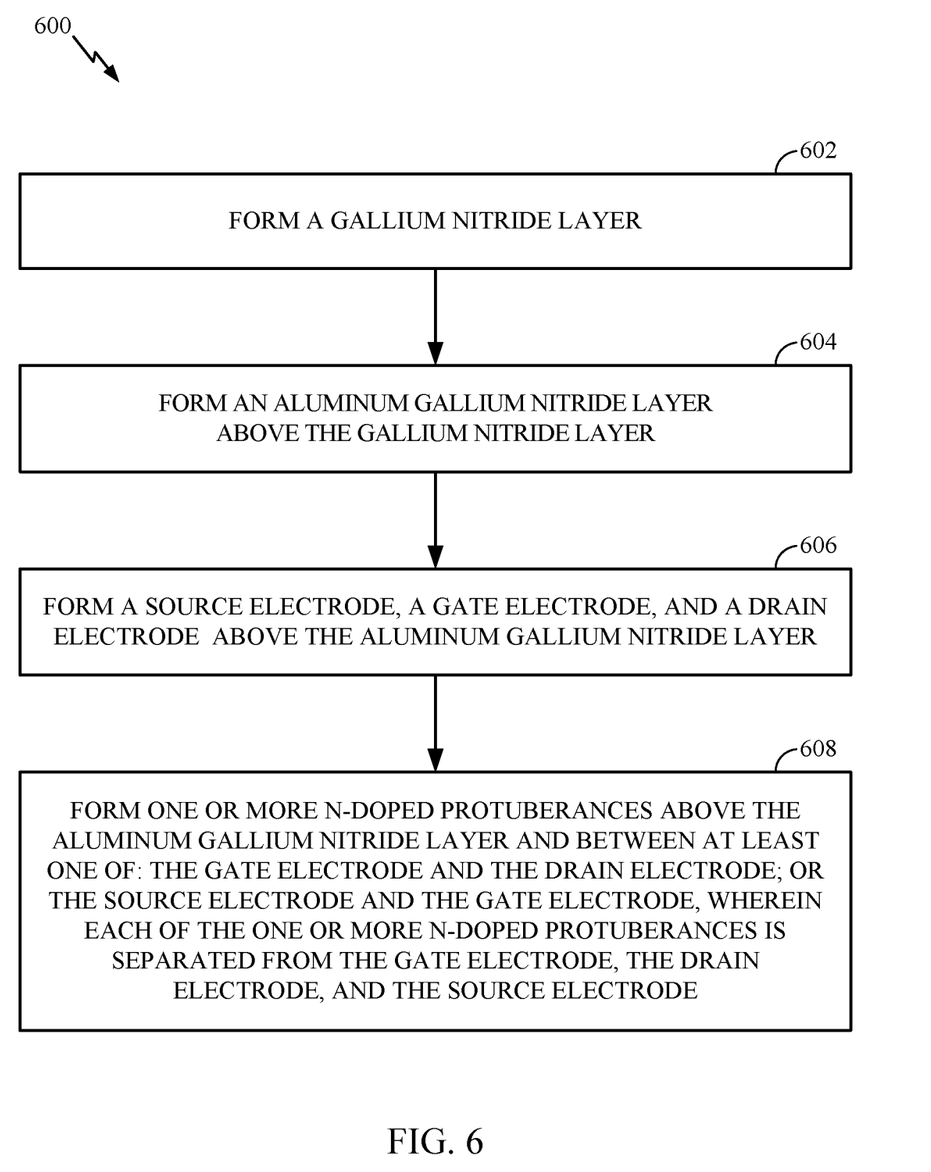
FIG. 6 is a flow diagram of example operations for fabricating a GaN-based HEMT with ledge(s), in accordance with certain aspects of the present disclosure.

FIG. 6 is a flow diagram of example operations 600 for fabricating a HEMT, in accordance with certain aspects of the present disclosure. The operations 600 may be performed, for example, by a semiconductor processing chamber.

The operations 600 may begin, at block 602, by forming a GaN layer (e.g., semiconductor region 106). At block 604, an AlGaN layer (e.g., semiconductor region 108) is formed above the GaN layer. At block 606, a source electrode (e.g., source electrode 210), a gate electrode (e.g., gate electrode 212), and a drain electrode (e.g., drain electrode 214) are formed above the AlGaN layer. At block 608, n-doped protuberance(s) (e.g., n-doped ledge(s) 240, 340, 440, 540) are formed above the AlGaN layer. The n-doped protuberance(s) are further formed between at least one of: the gate electrode and the drain electrode; or the source electrode and the gate electrode. Each of the n-doped protuberance(s) is separated from the gate electrode, the drain electrode, and the source electrode.

In some aspects, forming the n-doped protuberance(s) may include forming multiple n-doped protuberances. In some aspects, the operations 600 may include forming a passivation layer (e.g., passivation layer 216) and/or dielectric layer above the n-doped protuberance(s). In some aspects, forming the passivation layer may include forming the passivation layer above the AlGaN layer, such that the passivation layer is further disposed between the gate electrode (e.g., gate electrode 512) and the AlGaN layer. In some aspects, the operations 600 may include forming a dielectric layer above the AlGaN layer, and between the gate electrode (e.g., gate electrode 512) and the AlGaN layer. In some aspects, forming the gate electrode may include forming the gate electrode (e.g., gate electrode 212) directly adjacent to the AlGaN layer.

In some aspects, the operations 600 may include forming a metal plate (e.g., field plate 402, field plate 502) above the n-doped protuberance(s). In some aspects, the operations 600 may include forming two or more n-doped protuberances (e.g., n-doped ledges 440B, 440C, and 440D) having one or more trenches (e.g., trenches 442 and 444) therebetween, and forming the metal plate (e.g., field plate 402) by forming one or more protrusions (e.g., protrusions 450 and 452) that extend into the one or more trenches between the two or more n-doped protuberances. In some aspects, the operations 600 may include forming a passivation layer (e.g., passivation layer 216) above the n-doped protuberance(s), and between the metal plate and the n-doped protuberance(s).

In some aspects, a level of doping within the one or more n-doped protuberances may be non-uniform (e.g., n-doped ledges 340). Additionally, or alternatively, in some aspects, a level of doping within the one or more n-doped protuberances may be uniform (e.g. n-doped ledges 240).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A high electron mobility transistor (HEMT) comprising:
   a substrate;
   a buffer layer disposed above the substrate;
   a gallium nitride (GaN) layer disposed above the buffer layer;
   an aluminum gallium nitride (AlGaN) layer disposed above the GaN layer;
   a source electrode, a gate electrode, and a drain electrode disposed above the AlGaN layer;
   one or more n-doped protuberances disposed above on the AlGaN layer and disposed between at least one of:
      the gate electrode and the drain electrode; or
      the source electrode and the gate electrode, wherein each of the one or more n-doped protuberances is separated from the gate electrode, the drain electrode, and the source electrode; and
   a metal plate disposed above the one or more n-doped protuberances and separate from the gate electrode, wherein the one or more n-doped protuberances comprise two or more n-doped protuberances having one or more trenches therebetween, and wherein the metal plate comprises one or more protrusions extending into the one or more trenches between the two or more n-doped protuberances.

2. The HEMT of claim 1, further comprising a passivation layer disposed between the metal plate and the one or more n-doped protuberances.

3. The HEMT of claim 1, wherein the metal plate is electrically coupled to the source electrode.

4. The HEMT of claim 1, wherein the gate electrode is further disposed directly adjacent to the AlGaN layer.

5. The HEMT of claim 1, wherein a level of doping within the one or more n-doped protuberances is uniform or vertically non-uniform.

6. The HEMT of claim 1, further comprising a passivation layer disposed above the one or more n-doped protuberances.

7. The HEMT of claim 6, wherein the passivation layer is further disposed between the gate electrode and the AlGaN layer.

8. The HEMT of claim 6, wherein the passivation layer comprises silicon nitride ($Si_3N_4$).

9. The HEMT of claim 1, further comprising a dielectric layer disposed between the gate electrode and the AlGaN layer.

10. The HEMT of claim 1, wherein the one or more n-doped protuberances comprise at least one of gallium nitride (GaN), indium gallium nitride (InGaN), aluminum gallium nitride (AlGaN), or aluminum nitride (AlN).

* * * * *